United States Patent

Ono et al.

[11] Patent Number: 5,982,197
[45] Date of Patent: Nov. 9, 1999

[54] DYNAMIC CIRCUIT

[75] Inventors: Takeshi Ono; Satoshi Nonaka, both of Yokohama; Kaoru Terashima, Tokyo, all of Japan

[73] Assignee: Kabushiki Kaisha Toshiba, Kawasaki, Japan

[21] Appl. No.: 08/888,267

[22] Filed: Jul. 3, 1997

[30] Foreign Application Priority Data

Jul. 4, 1996 [JP] Japan .................................. 8-174834

[51] Int. Cl.⁶ .............................................. H03K 19/0948
[52] U.S. Cl. ................................................ 326/95; 326/98
[58] Field of Search ...................... 326/95, 98, 105–108, 326/112, 119, 120, 121, 122

[56] References Cited

U.S. PATENT DOCUMENTS

| | | | |
|---|---|---|---|
| 4,563,598 | 1/1986 | Oritani | 326/98 |
| 4,651,029 | 3/1987 | Oritani | 326/98 |
| 5,291,076 | 3/1994 | Bridges et al. | 326/95 |
| 5,432,463 | 7/1995 | Wong et al. | 326/32 |

FOREIGN PATENT DOCUMENTS

| | | |
|---|---|---|
| 4-56412 | 2/1992 | Japan . |
| 5-62490 | 3/1993 | Japan . |
| 5-167432 | 7/1993 | Japan . |
| 7-154240 | 6/1995 | Japan . |

Primary Examiner—Tuan T. Lam
Attorney, Agent, or Firm—Banner & Witcoff. Ltd.

[57] ABSTRACT

A dynamic circuit that prevents a malfunction, even when the operating temperature is high, including a pre-charging circuit connected between a power source node and a signal wiring, a plurality of discharging circuits being connected between a power source node and a signal wiring, a plurality f discharging circuit connected between the signal wiring and a ground potential respectively and for being selectively turn-ON/OFF controlled, a leakage current detecting circuit for detecting a current corresponding to a leakage current generated between the signal wiring and the ground potential in the turn-OFF state of each discharging circuit, and a leakage current correcting circuit connected between the power source node and the signal wiring and for continuously supplying to the signal wiring a leakage correction current equivalent to a leakage current of the signal wiring corresponding to a detected current of the leakage current detecting circuit during a leakage current correction period.

16 Claims, 6 Drawing Sheets

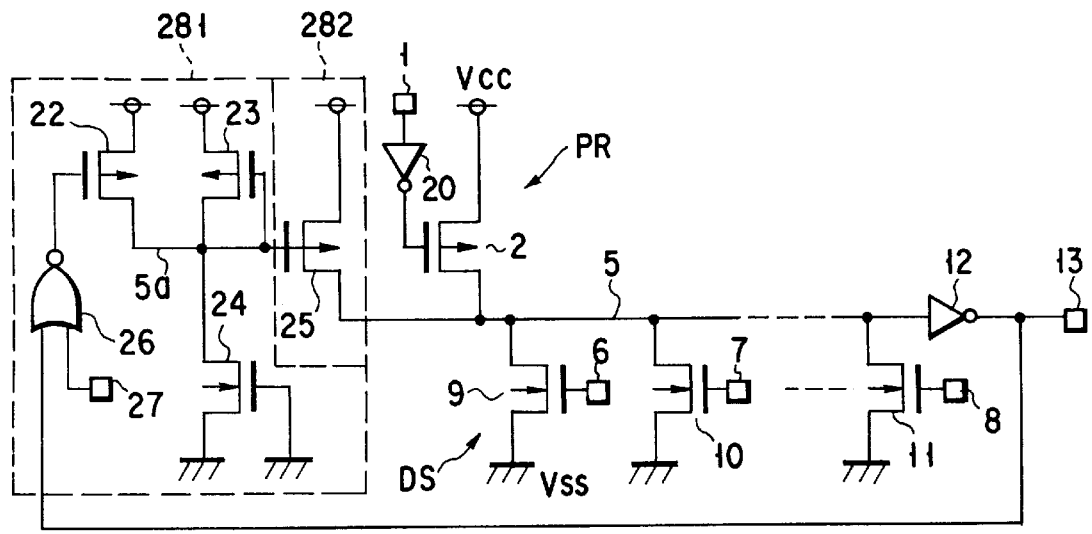
F I G. 4
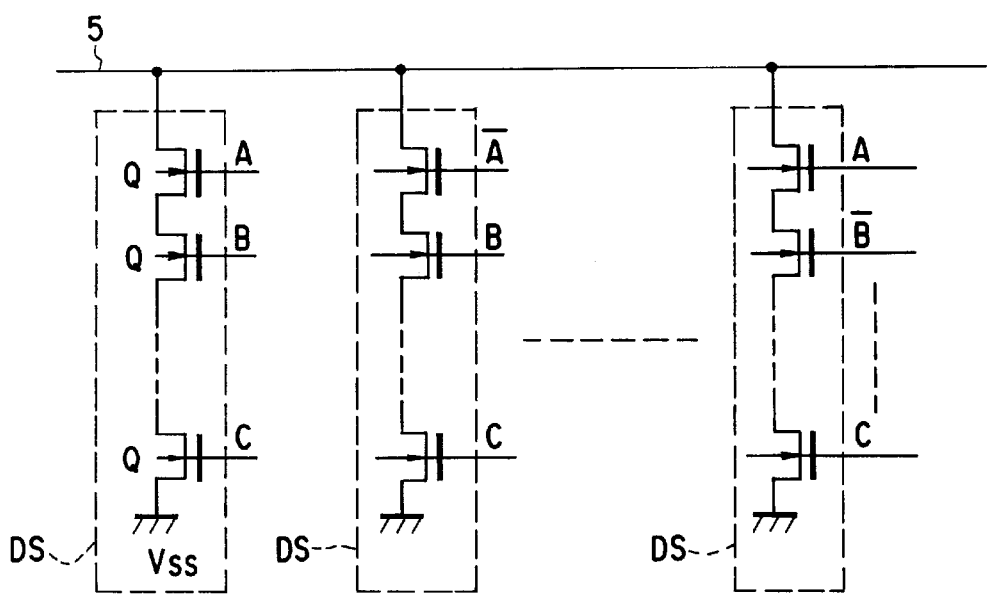
F I G. 5

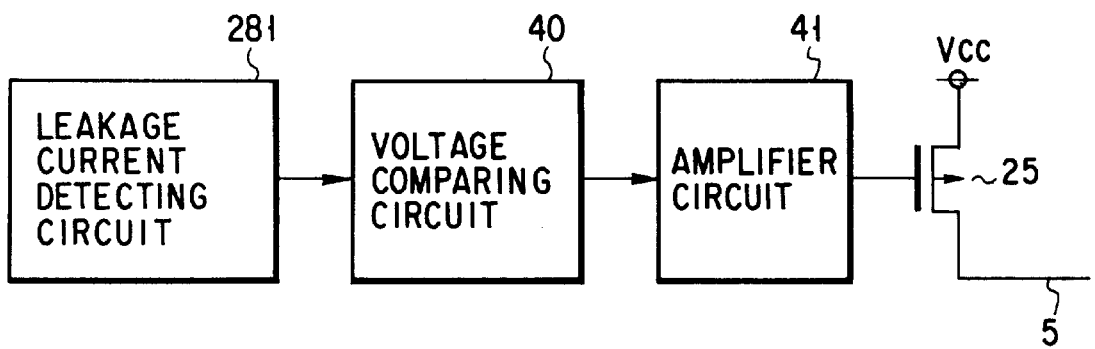
F I G. 8

DYNAMIC CIRCUIT

BACKGROUND OF THE INVENTION

The present invention relates to a dynamic circuit formed on a semiconductor integrated circuit, and relates more particularly to a leakage correcting circuit of a dynamic logical circuit having a pre-charging function which is used, for example, in a dynamic circuit of a digital signal processor.

FIG. 1 shows a prior-art example of a dynamic logical circuit having a pre-charging function.

In FIG. 1, a source and a drain of a PMOS transistor 2 for a pre-charging are connected between a Vcc node to which a power source potential Vcc is supplied and a signal wiring 5 such as an aluminum wiring, for example, and a first inverter circuit 20 is inserted between a pre-charge control signal input node 1 and the PMOS transistor 2.

Each drain of a plurality (a few to several dozens) of NMOS transistors 9, 10, - - - , 11 is connected (wired NOR connection) in common to the signal wiring 5. Each source of these plurality of NMOS transistors is connected to a ground potential (Vss) node and a selective input signal is applied from input signal nodes 6, 7, - - - , 8 corresponding to each gate.

A second inverter circuit 12 for an output driving is inserted between the signal wiring 5 and a signal output node 13.

On the other hand, a leakage correcting circuit 21 has a source and a drain of PMOS transistor 3 for supplying a leakage correction current connected between the Vcc node and the signal wiring 5 and has a third inverter circuit 4 inserted between the signal wiring 5 and the gate of the PMOS transistor 3.

The leakage correcting circuit 21 is provided to correct a reduction of a potential of the signal wiring 5 due to a leakage current which flows slightly between the drains and the sources of the NMOS transistors even if no voltage is being applied to the gates of the NMOS transistors 9, 10, - - - , 11 of which drains are connected to the signal wiring 5.

In this case, the leakage correction current supply quantity of the leakage correcting circuit 21 is set to correspond to the estimate quantity of the leakage current of the NNOS transistors.

Next, an ideal operation of the dynamic logical circuit will be explained below with reference to a timing waveform diagram shown in FIG. 2.

At first, during a period while the pre-charge control signal input is at an "H" level, the PMOS transistor 2 for pre-charging is set to an ON state by an output of "L" level of the first inverter circuit 20.

Then, the signal wiring 5 is pre-charged to the Vcc potential ("H" level) and the output of the second inverter circuit 12 or the potential of the signal output node 13 is set to an "L" level.

Next, the pre-charge control signal input 1 becomes the "L" level, and when one or a plurality of NMOS transistors are selected and turned on during this period by a selective input signal (only the waveform of the node 6 is shown representatively) of the input signal nodes 6, 7, - - - , 8, the potential of the signal wiring 5 is discharged. When the potential of the signal wiring 5 drops to a level not higher than the threshold voltage of the second inverter circuit 12 for output driving, the potential of the signal output node 13 is inverted to the "H" level.

The PMOS transistor 3 of the leakage correcting circuit 21 remains in the turn-ON state by the "L" level output of the third inverter circuit 4 until when the potential of the signal wiring 5 has dropped to a level not higher than the threshold voltage of the third inverter circuit 4 for supplying a leakage correction current, and the leakage correcting circuit 21 is continuing the supply of the leakage correction current to the signal wiring 5 so as to correct the reduction of the potential of the signal wiring 5 due to the leakage current of the NMOS transistors.

When the potential of the signal wiring 5 drops to a level not higher than the threshold voltage of the third inverter by the above-described logical operation, the PMOS transistor 3 for supplying a leakage correction current is set to the turn-OFF state by the "H" level output of the third inverter circuit 4.

However, there is a case where a malfunction occurs because the actual operation waveform of the dynamic logical circuit becomes as shown in FIG. 3, for example. In other words, since the leakage current of each NMOS transistor increases in proportion to a temperature rise, the leakage current of the NMOS transistors increases to exceed the leakage correction current supply quantity of the leakage correcting circuit 21 when the operation temperature is high. When the potential of the signal wiring 5 has dropped to a level not higher than the estimated value and further dropped to a level not higher than the threshold voltage of the second inverter circuit 12 for output driving as shown in FIG. 3, there occurs such a malfunction that the potential of the signal output node 13 is inverted to the "H" level.

In this case, when the potential of the signal wiring 5 has dropped to a level not higher than the threshold voltage the third inverter circuit 4 for supplying a leakage correction current, the PMOS transistor 3 for supplying a leakage correction current is set to the turn-OFF state by the "H" level output of the third inverter circuit 4, so that the leakage correction current is not supplied.

In order to avoid the above-described malfunction, various countermeasures can be considered such as the driving capacity of the third inverter circuit 4 for supplying a leakage correction current in the leakage correcting circuit 21 is increased or the threshold voltage of the third inverter circuit 4 is lowered.

According to the above countermeasures, however, when only a limited number (for example, only one) of the NMOS transistors is selectively turned on by the selective input signal, the speed for discharging the load of the signal wiring 5 is lowered, with a result that the speed of the logical operation until a normal potential is outputted to the signal output node 13 is lowered.

The Jpn. Pat. Appln. KOKAI Publication No. 5-62490 discloses a technique for deciding whether the potential of a bit line has dropped to a certain level by a leakage of an electrical load and, when the drop has been decided, for preventing a drop of the potential of the bit line due to the leakage by adding a capacity to the bit line, with a view to preventing an error due to the leakage of the electrical load at the time of reading a memory data in a read only semiconductor memory.

The above-described technique, however, does not prevent a malfunction attributable to the fact that the leakage current estimated quantity and the leakage correction current supply quantity are set an imbalanced state depending on the temperature.

BRIEF SUMMARY OF THE INVENTION

As described above, the conventional leakage current correcting circuit of the dynamic circuit has a problem in that when the operation temperature is high, the leakage current of a plurality of NMOS transistors exceeds the leakage correction current supply quantity so that a malfunction occurs in the logical operation attributable to the drop in the potential of the signal wiring.

The present invention has been provided to eliminate the above-described drawbacks, and it is an object of the present invention to provide a dynamic circuit which can prevent a malfunction, even when the operation temperature is high, by correcting a drop of a potential attributable to a leakage current of a signal wiring connected in common to a plurality of discharging circuits, and which can prevent a reduction in the operation speed without giving a bad influence to a discharge operation of a signal wiring load when the plurality of discharging circuits have been selectively turned on.

A dynamic circuit of the present invention includes a pre-charging circuit having a source and a drain connected between a power source node and a first signal wiring, having a pre-charging MOS transistor of a first conduction type of which gate potential is controlled by a pre-charge control signal, and for charging the first signal wiring to a power potential during a period while the gate potential is controlled by the pre-charge control signal; a plurality of discharging circuits connected between the first signal wiring and a ground potential respectively and for being turn-ON/OFF controlled according to an input signal applied correspondingly; a leakage current detecting circuit for detecting a current corresponding to a leakage current generated between the first signal wiring and the ground potential in the turn-OFF state of each discharging circuit; and a leakage current correcting circuit connected between the power source node and the first signal wiring and for continuously supplying to the first signal wiring a leakage correction current equivalent to a leakage current of the first signal wiring corresponding to a detected current of the leakage current detecting circuit during a leakage current correction period.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 4 is a circuit diagram for showing a dynamic logical circuit relating to a first embodiment of the present invention;

FIG. 5 is a circuit diagram for showing another example of each discharging circuit shown in FIG. 4;

FIG. 8 is a circuit diagram for showing a modified example of the dynamic logical circuit shown in FIG. 4.

DETAILED DESCRIPTION OF THE INVENTION

Figure 1:
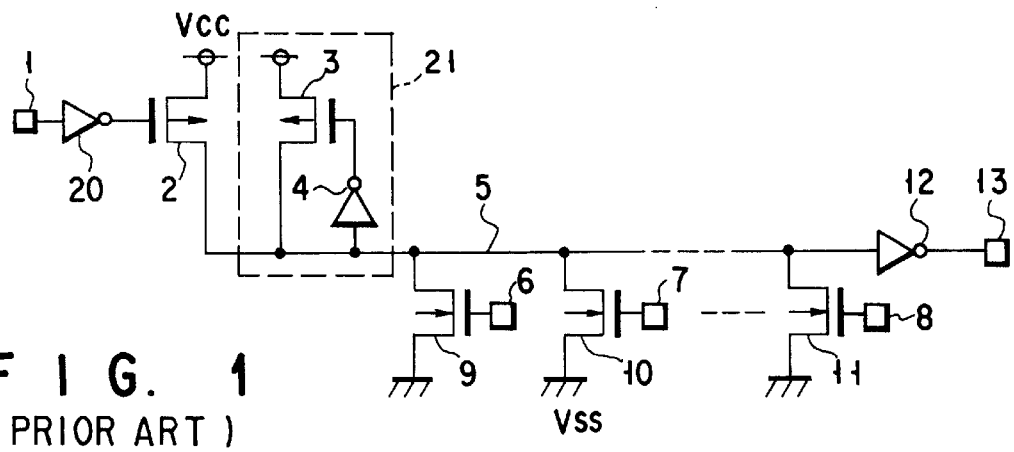
FIG. 1 is a circuit diagram for showing a conventional example of a dynamic logical circuit having a pre-charging function.
Figure 2:
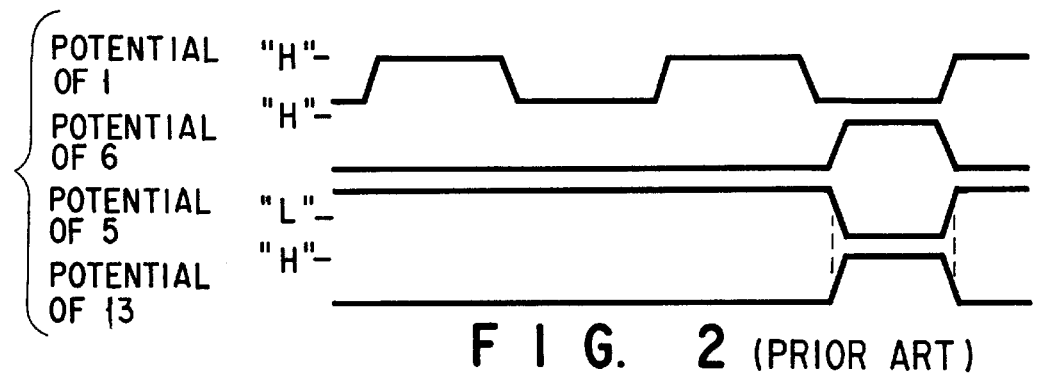
FIG. 2 is a timing waveform diagram for showing an ideal operation of the dynamic logical circuit shown in FIG. 1.

Embodiments of the present invention will be explained in detail with reference to the drawings.

FIG. 4 shows a dynamic logical circuit relating to a first embodiment of the present invention. In FIG. 4, a pre-charging circuit PR is connected between a Vcc node to which a power source potential Vcc is supplied and a first signal wiring 5 such as an aluminum wiring, for example.

An example of the pre-charging circuit PR has a pre-charging PMOS transistor 2 of which source and drain are connected between the Vcc node and the first signal wiring 5 and a first inverter circuit 20 inserted between a pre-charge control signal input node 1 and the gate of the PMOS transistor 2. A plurality (a few to several dozens) of discharging circuits DS are connected in parallel (wired NOR connection by the first signal wiring) between the first signal wiring 5 and a Vss node. Each discharging circuit is turn-ON/OFF controlled according to an input signal correspondingly applied to the discharging circuit. A second inverter circuit 12 for output driving is inserted between the first signal wiring 5 and the signal output node 13.

As an example of each discharging circuit DS, when a drain is connected to the first signal wiring 5 and a source is connected to the Vss node and when NMOS transistors 9, 10, - - - , 11 of which gates are applied with selective input signals from input signal nodes 6, 7, - - - , 8 are used, a NOR gate is structured as a whole for each discharging circuit DS.

As another example of each discharging circuit DS, as shown in FIG. 5, when a plurality of NMOS transistors Q are connected in series between the first signal wiring 5 and the Vss node respectively and when a NAND gate to which a selective input signal is applied corresponding to the gate of each NMOS transistor Q is used, a NOR gate is structured which takes a logical sum of each output of the plurality of NAND gates as a whole of each discharging circuit DS.

The dynamic logical circuit shown in FIG. 4 is provided with a leakage current detecting circuit 281 for detecting a current corresponding to a leakage current generated between the first signal wiring 5 and the Vss node in the turn-OFF state of each of the discharging circuits, and a leakage current correcting circuit 282 connected between the power source node and the first signal wiring and for continuously supplying to the first signal wiring 5 a leakage correction current equivalent to a leakage current of the first signal wiring 5 corresponding to a detected current of the leakage current detecting circuit during a time of a leakage current correction.

The leakage current detecting circuit 281 includes a PMOS transistor 22 of which source and drain are connected between the Vcc node and a second signal wiring 5a and which charges the second signal wiring 5a to the power source potential during a period while the leakage current detecting circuit 281 is being ON controlled by the precharge control signal or by the potential of the first signal wiring 5, a NMOS transistor 24 for detecting a leakage current of which drain and source are connected between the second signal wiring 5a and the Vss node and of which gate is connected to the ground potential, and a PMOS transistor 23 for pull-up of which source and drain are connected between the Vcc node and the second signal wiring 5a and of which gate is connected to the second signal wiring 5a.

The gate of the PMOS transistor 22 for pre-charging is applied with an output signal of a NOR circuit 26 which carries out a NOR processing by being applied with a pre-charge control signal supplied to a pre-charge control signal input node 27 (same as the pre-charge control signal supplied to the pre-charge control signal input node 1) and an output signal of the second inverter circuit 12 for output driving. The PMOS transistor 22 for pre-charging and the PMOS transistor 23 for pull-up have the same dimensions.

According to the present example, the NMOS transistor 24 for detecting a leakage current is set to a size so that a current which is equivalent to the leakage current generated between the first signal wiring 5 and the Vss node flows through this transistor 24. When n NMOS transistors 9, 10, - - -, 11 are used as shown in FIG. 1 as each discharging circuit DS, the channel width of the NMOS transistor 24 for detecting a leakage current is set to n times of the width W of each channel of the n NMOS transistors 9, 10, - - -, 11 of which drains are connected in common to the first signal wiring 5.

The leakage current correcting circuit 282 is structured by a PMOS transistor 25 of which source and drain are connected between the Vcc node and the first signal wiring 5 and of which gate is connected with the second signal wiring 5a.

The operation of the dynamic logical circuit will be explained next.

(1) While the pre-charge control signal input is at the "H" level (pre-charging period), the PMOS transistor 2 for pre-charging is kept in the turn-ON state by the "L" level output of the first inverter circuit 20, the first signal wiring 5 is pre-charged to the Vcc potential ("H" level) and the output of the second inverter circuit 12 or the potential of the signal output node 13 is kept at the "L" level.

In this case, in the leakage current detecting circuit 281, the PMOS transistor 22 for pre-charging is in the ON state by the "L" level output of the NOR circuit 26, the second signal wiring 5a is being pre-charged to the Vcc potential and the PMOS transistor 23 for pull-up is in the turn-OFF state. With the above arrangement, the PMOS transistor 25 for supplying a leakage correction current of the leakage current correcting circuit 282 is being kept in the turn-OFF state.

(2) While the pre-charge control signal input is at the "L" level (non-pre-charging period), when one or a plurality of the NMOS transistors 9, 10, - - -, 11 are selectively turned on by a selective input signal, the potential of the first signal wiring 5 is discharged. When the potential of the first signal wiring 5 is lowered to a level not higher than the threshold value of the second inverter circuit 12 for output driving, the potential of the signal output node 13 is inverted from the "L" level to the "H" level.

During the non-pre-charging period, while the first signal wiring 5 is at the "H" level (the potential of the signal output node 13 is at the "L" level), the output of the NOR circuit 26 of the leakage current detecting circuit 281 is maintained at the "H" level and the PMOS transistor 22 for pre-charging is in the OFF state, so that a current which is of the same size as that of the leakage current of the plurality of NMOS transistors 9, 10, - - -, 11 flows through the NMOS transistor 24 for detecting a leakage current. This works in a trend to lower the potential of the second signal wiring 5a. However, the PMOS transistor 23 for pull-up is shifted to the turn-ON state so that the potential of the second signal wiring 5a is pulled up to the Vcc potential.

In this case, in the leakage current correcting circuit 282, the PMOS transistor 25 for supplying the leakage correction current is being kept in the ON state by the potential of the second signal wiring 5a so that the potential of the first signal wiring 5 is pulled up to the Vcc potential. In this case, when the leakage current of the plurality of NMOS transistors 9, 10, - - -, 11 increases and the drop in the potential of the first signal wiring 5 is made larger, the leakage current of the NMOS transistor 24 for detecting a leakage current is also increased and the drop in the potential of the second signal wiring 5a is made larger, with a result that the supply quantity of the leakage correction current of the PMOS transistor 25 for supplying a leakage correction current becomes larger and the correction quantity against the drop in the potential of the first signal wiring 5 also becomes larger.

In other words, the PMOS transistor 25 for supplying a leakage correction current supplies a leakage correction current to the first signal wiring 5 in such a way as to correct the drop in the potential of the first signal wiring 5 attributable to the leakage current of the NMOS transistors 9, 10, - - -, 11.

On the other hand, when one or a plurality of the NMOS transistors 9, 10, - - -, 11 have been selected and turned on so that the potential of the signal output node 13 becomes the "H" level, during the non-pre-charging period, the output of the NOR circuit 26 the leakage current detecting circuit 281 becomes the "L" level and the operation state similar to that of the pre-charging period is obtained.

In other words, according to the above-described dynamic logical circuit, even if the potential of the first signal wiring 5 has been dropped by the leakage current generated between the first signal wiring 5 commonly connected to the plurality of discharging circuits DS and the ground potential, it is possible to detect a current of the same size as that of the leakage current by the leakage current. detecting circuit 281 connected to the second signal wiring 5a provided separately from the first signal wiring 5 and to prevent the drop in the potential of the first signal wiring 5 by feedback supplying the leakage correction current corresponding to the detected leakage current to the first signal wiring 5.

Accordingly, it is possible to prevent a malfunction by an accurate leakage correction even if the leakage current has increased along with the rise in the operation temperature, and it becomes possible to manage easily the low-frequency operation.

Further, since the leakage current correcting circuit 282 corrects only the leaked current and the leakage current detecting circuit 281 is connected to the second signal wiring 5a provided separately from the first signal wiring 5, even if the load of the first signal wiring 5 is discharged when only a part of the discharging circuits DS has been selectively turned on, there is no bad effect applied to the discharging operation. Moreover, the drop in the speed of the circuit operation can be prevented because the supply of the leakage correction current by the leakage current correcting circuit 282 is stopped when the potential of the first signal wiring 5 has become the "L" level (the potential of the signal output node 13 is the "H" level) by the discharging operation.

Figure 3:
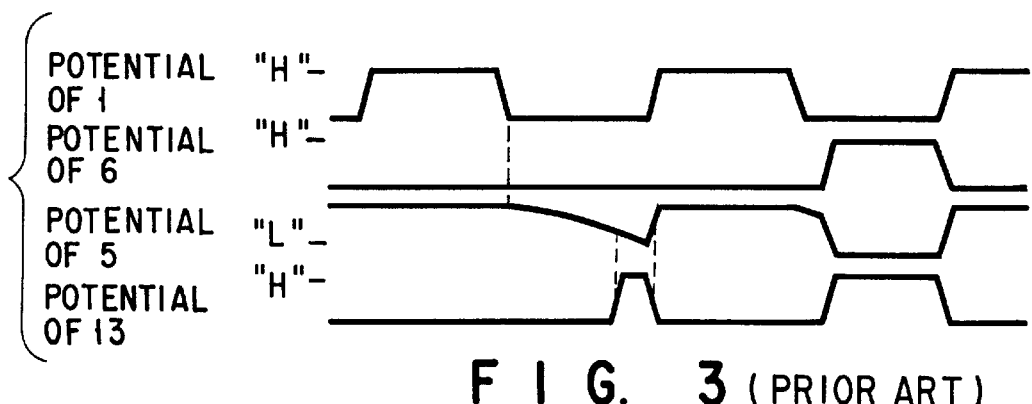
FIG. 3 is a timing waveform diagram for showing an operation of the case where the operation temperature of the dynamic logical circuit is high.
Figure 6:
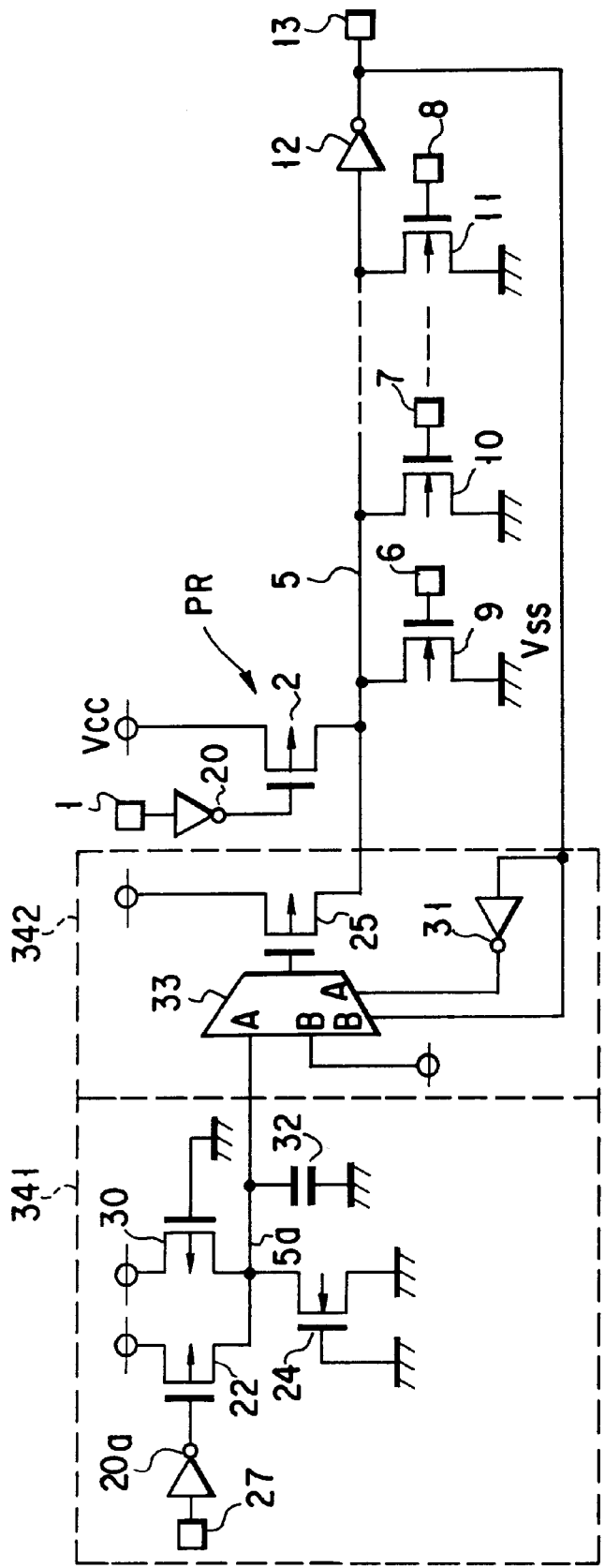
FIG. 6 is a circuit diagram for showing a dynamic logical circuit relating to a second embodiment of the present invention.

FIG. 6 shows a dynamic logical circuit relating to a second embodiment of the present invention. The dynamic logical circuit shown in FIG. 6 is different from the dynamic logical circuit shown in FIG. 4 in (1) the leakage current detecting circuit 341 and (2) the leakage current correcting circuit 342, and all the rest are the same which are attached with the same reference numbers as those in FIG. 3.

The leakage current detecting circuit 341 includes a PMOS transistor 22 which is connected between the Vcc node and a second signal wiring 5a and which charges the second signal wiring 5a to the power source potential during a period while the leakage current detecting circuit 341 is being turn-ON controlled by the pre-charge control signal, a NMOS transistor 24 for detecting a leakage current of which drain and source are connected between the second signal wiring 5a and the Vss node and of which gate is connected to the ground potential, a PMOS transistor 30 of which source and drain are connected between the Vcc node and the second signal wiring 5a and of which gate is connected to the ground, and a capacitor 32 connected between the second signal wiring 5a and the Vss node and having a capacity value equivalent to the parasitic capacity of the first signal wiring 5. A signal which is the pre-charge control signal supplied to a pre-charge control signal input node 27 inverted by a third inverter circuit 20a, is applied to the gate of the PMOS transistor 22 for pre-charging.

The PMOS transistor 30 is added to set the second signal wiring 5a to a predetermined potential and may be omitted if not necessary.

The leakage current correcting circuit 342 includes a PMOS transistor 25 for supplying a leakage correction current of which source and drain are connected between the Vcc node and the first signal wiring 5 and a change-over circuit for selectively applying the potential of the second signal wiring 5a or the power source potential to the gate of the PMOS transistor 25 for supplying the leakage correction current according to the logical level of the potential of the first signal wiring 5.

This change-over circuit has a multiplexer circuit 33 having a first signal input node, a second signal input node, a first control input node and a second control input node. The potential of second signal wiring 5a is applied to the first signal input node and the power potential is applied to the second signal input node. A signal which is the output signal of the second inverter circuit 12 for output driving inverted by a fourth inverter circuit 31, is applied to the first control input node and the output signal of the second inverter circuit 12 for output driving is applied to the second control input node.

The operation of the dynamic logical circuit shown in FIG. 6 is slightly different from the above-described operation of the dynamic logical circuit shown in FIG. 4 in the operation of the leakage current detecting circuit and the leakage current correcting circuit. The different operation will be explained below.

(1) During the pre-charging period, the PMOS transistor 22 for pre-charging is in the turn-ON state by the "L" level output of the third inverter circuit 20a of the leakage current detecting circuit 341, so that the capacitor 32 is being pre-charged to the Vcc potential.

In this case, the potential of the signal output node 13 is in the "L" level. By the "H" level output of the fourth inverter circuit 31, the multiplexer circuit 33 selects the input of the first signal input node (the potential of the second signal wiring 5a) and applies this input to the gate of the PMOS transistor 25 for supplying a leakage correction current.

(2) During the non-pre-charging period, the PMOS transistor 22 for pre-charging is set to the OFF state by the "H" level output of the third inverter circuit 20a of the leakage current detecting circuit 341.

When one or a plurality of the NMOS transistors 9, 10, - - -, 11 are selected and turned on by the selective input signal, the potential of the first signal wiring 5 is discharged. When the potential of the first signal wiring 5 has dropped to a level not higher than the threshold value of the second inverter circuit 12 for output driving, the potential of the signal output node 13 is inverted from the "L" level to the "H" level.

In this case, during the period while the first signal wiring 5 is at the "H" level (the potential of the signal output node 13 ia the "L" level), when the drop in the potential of the first signal wiring 5 becomes larger due to the increase in the leakage current of the plurality of NMOS transistors 9, 10, - - -, 11, the drop in the potential of the second signal wiring 5a also becomes larger due to the increase in the leakage current of the NMOS transistor 24 for detecting a leakage current. As a result, the supply quantity of the leakage correction current of the PMOS transistor 25 for supplying a leakage correction current also becomes larger so that the correction quantity of the reduction in the potential of the first signal wiring 5 becomes larger.

On the other hand, when the first signal wiring 5 has become the "L" level (the potential of the signal output node 13 is in the "H" level), the output of the fourth inverter circuit 31 becomes the "L" level. By the "H" level output of the signal output node 13, the multiplexer circuit 33 selects the input of the second signal input node (the power source potential) and applies this input to the gate of the PMOS transistor 25 for supplying a leakage correction current, so that the PMOS transistor 25 for supplying a leakage correction current is set to the turn-OFF state.

Figure 7:
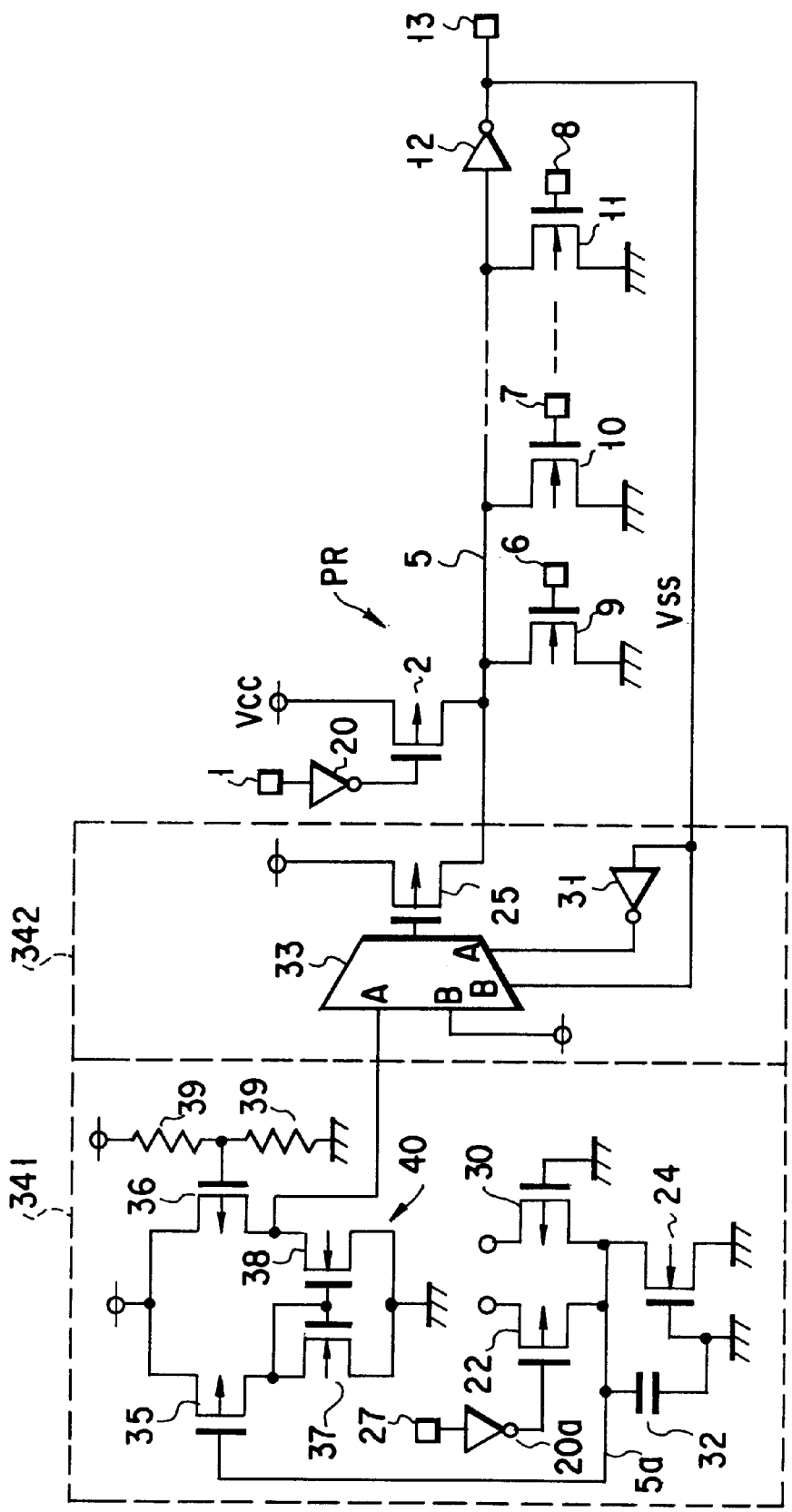
FIG. 7 is a circuit diagram for showing a dynamic logical circuit relating to a third embodiment of the present invention.

FIG. 7 shows a dynamic logical circuit relating to a third embodiment of the present invention. The dynamic logical circuit shown in FIG. 7 is different from the dynamic logical circuit shown in FIG. 6 in that the leakage current detecting circuit 341 additionally has a voltage comparing circuit 40 for comparing the potential of the second signal wiring 5a with a predetermined reference input potential and that the multiplexer circuit 33 of the leakage current correcting circuit 342 selectively applies the output potential of the voltage comparing circuit 40 or the power source potential to the gate of the PMOS transistor 25 for supplying a leakage correction current. All the rest are the same which are attached with the same reference numbers as those in FIG. 6.

For the voltage comparing circuit 40, a P-top type differential amplifier circuit made up of PMOS transistors 35 and 36 for input and NMOS transistors 37 and 38 for a current mirror load, for example, is used.

Further, in order to generate a reference input potential of the voltage comparing circuit 40, a power source voltage dividing circuit made up of a group of resistor elements 39 structured by a polycrystalline silicon or a diffusion layer, for example, is used.

The operation of the dynamic logical circuit shown in FIG. 7 is slightly different from the above-described operation of the dynamic logical circuit shown in FIG. 6 in the operation of the leakage current detecting circuit 341. The different operation will be described below.

During the period while the multiplexer circuit 33 selectively applies the input of the first signal input node to the gate of the PMOS transistor 25 for supplying a leakage correction current and the PMOS transistor 25 supplies the leakage correction current, the voltage comparing circuit 40 compares the potential of the second signal wiring 5a with a predetermined reference input potential and selects an output potential of the voltage comparing circuit outputted corresponding to the drop in the potential of the second signal wiring 5a.

In the above-described dynamic logical circuit shown in FIG. 7, it becomes possible to freely set a detection point of the drop in the potential of the second signal wiring 5a by freely setting the reference input potential of the voltage comparing circuit 40. With the above arrangement, is possible to set the detection point so that the NMOS transistor 24 for detecting a leakage current can detect a current which is of the same size as that of the leakage current generated between the first signal wiring 5 and the ground potential or detect a current of which size is different from that of the leakage current of the first signal wiring 5.

This has such an advantage that the pattern layout becomes easy by setting the size of the NMOS transistor 24 for detecting a leakage current to be able to detect a small current corresponding to the leakage current when there is a problem in the pattern layout if the size of the NMOS transistor 24 is set to detect a large current of which size is equivalent to that of the leakage current.

In the dynamic logical circuit shown in FIG. 7, the output potential of the voltage comparing circuit 40 may also be inputted to the multiplexer circuit 33 after being amplified when necessary.

As shown in FIG. 8, as a modification of the dynamic logical circuit shown in FIG. 4, this dynamic logical circuit may also have additionally the voltage comparing circuit 40 and, if necessary, an amplifier circuit 41, similar to the dynamic logical circuit shown in FIG. 7, and the output potential may be applied to the gate of the PMOS transistor 25 for supplying a leakage correction current.

Further, in each of the above-described embodiments of the present invention, it is also possible to use at the same time the leakage current correcting circuit 21 in the conventional dynamic logical circuit described with reference to FIG. 1.

Figure 9:
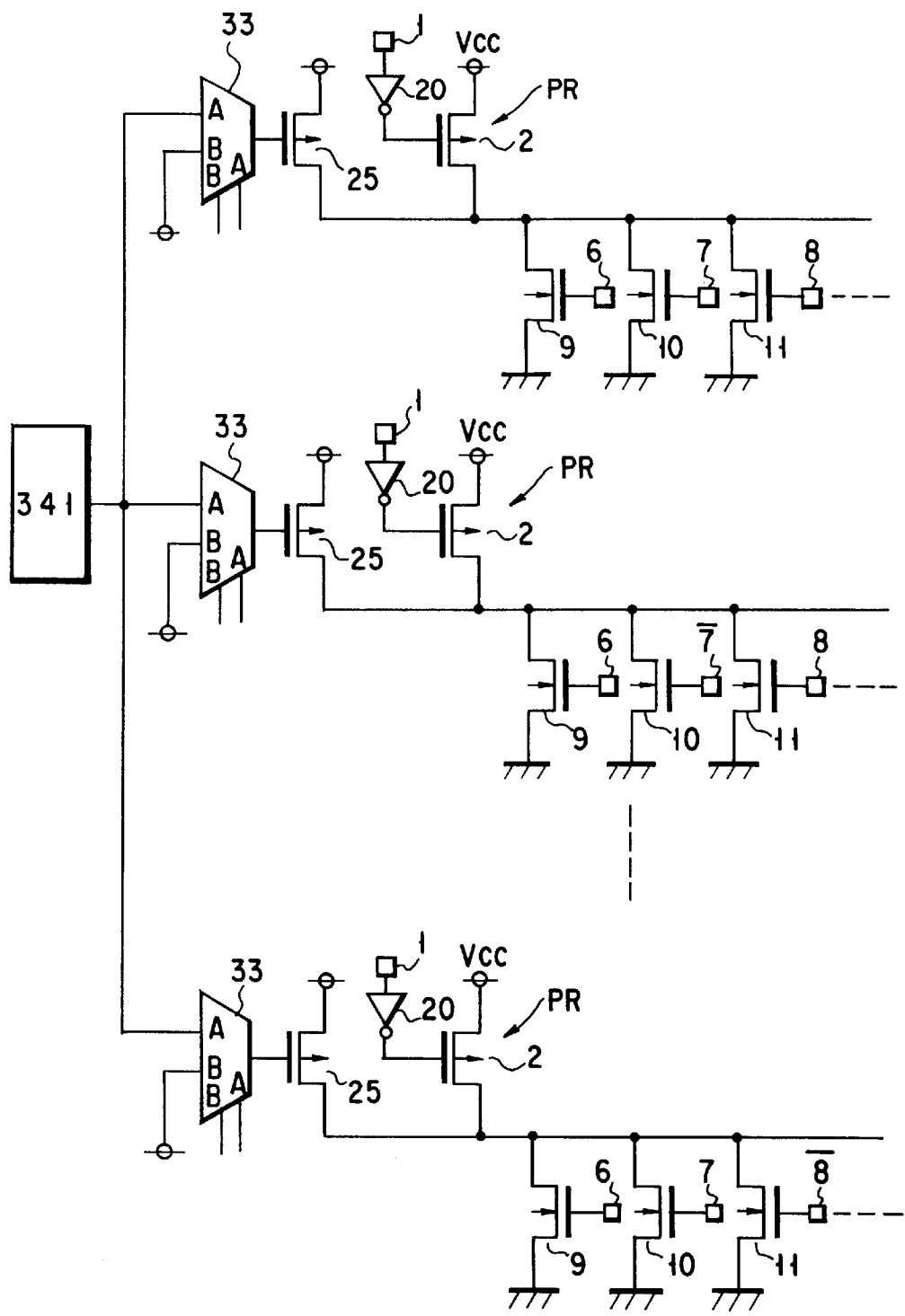
FIG. 9 is a circuit diagram for showing a modified example of the dynamic logical circuit shown in FIGS. 6 and 7.

As shown in FIG. 9, as a modification of the dynamic logical circuit shown in FIG. 6, this dynamic logical circuit may also have additionally connected discharging circuits. In this circuit, since only one leak detecting circuit 341 is used, a circuit layout is made compact.

As described above, according to the dynamic circuit of the present invention, it is possible to prevent an occurrence of a malfunction by correcting a drop in the potential due to the leakage current of the signal wiring commonly connected to a plurality of discharging circuits even if the operation temperature is high and it is possible to prevent a drop in the operation speed without giving a bad influence to the discharging operation of the signal wiring load when a plurality of discharging circuits have been selectively turned on.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. A dynamic circuit, comprising:

a pre-charging circuit having a source and a drain connected between a power source node at a power source potential and a first signal wiring, said pre-charging circuit having a pre-charging MOS transistor of a first conductivity type, said pre-charging MOS transistor having a gate controlled by a pre-charge control signal, said pre-charging circuit for charging said first signal wiring to the power source potential during a period while said gate is controlled by said pre-charge control signal;

a plurality of discharging circuits connected between said first signal wiring and a ground potential, respectively, and for being turn-ON/OFF controlled according to a corresponding input signal;

a leakage current detecting circuit for detecting a current equivalent to a leakage current generated between said first signal wiring and said ground potential in a turn-OFF state of each of said discharging circuits, the leakage current detecting circuit including a leakage current detecting transistor set to a size so that the current that is equivalent to the leakage current flows through the leakage current detecting transistor; and a leakage current correcting circuit connected between said power source node and said first signal wiring and to the leakage current detecting circuit for continuously supplying to said first signal wiring a leakage correction current equivalent to the leakage current of said first signal wiring during a time of a leakage current correction.

2. A dynamic circuit according to claim 1, wherein each of said discharging circuits includes a plurality of MOS transistors of a second conductivity type, the plurality of discharging circuits being connected in parallel with each other between said first signal wiring and said ground potential and configured to be applied with the corresponding input signal to each gate of said MOS transistors included in said discharging circuits.

3. A dynamic circuit according to claim 1, wherein each of said discharging circuits includes a plurality of MOS transistors of a second conductivity type which are connected in series with each other between said first signal wiring and said ground potential and configured to be applied with the corresponding input signal to each gate of said MOS transistors included in said discharging circuits.

4. A dynamic circuit according to claim 1, wherein said plurality of discharging circuits consists of n number of the discharging circuits, each of said discharging circuits including a discharging transistor having a channel width W, said leakage current detecting transistor having a channel width of n times W.

5. A dynamic circuit according to claim 1, wherein said plurality of discharging circuits consists of n number of the discharging circuits, each of said discharging circuits including a discharging transistor having a channel width, said leakage current detecting transistor having a channel width equal to a sum of the channel widths of each of the discharging transistors.

6. A dynamic circuit according to claim 1, wherein said leakage current detecting transistor is a MOS transistor of a second conductivity type.

7. A dynamic circuit, comprising:

a pre-charging circuit having a source and a drain connected between a power source node at a power source potential and a first signal wiring, said pre-charging circuit having a pre-charging MOS transistor of a first conductivity type, said pre-charging MOS transistor having a gate controlled by a pre-charge control signal, said pre-charging circuit for charging said first signal wiring to the power source during a period while said gate potential is controlled by said pre-charge control signal;

a plurality of discharging circuits connected between said first signal wiring and a ground potential, respectively, and for being turn-ON/OFF controlled according to a corresponding input signal;

a leakage current detecting circuit for detecting a current corresponding to a leakage current generated between said first signal wiring and said ground potential in a turn-OFF state of each of said discharging circuits; and a leakage current correcting circuit connected between said power source node and said first signal wiring and to the leakage current detecting circuit for continuously supplying to said first signal wiring a leakage correction current equivalent to the leakage current of said first signal wiring during a time of a leakage current correction, wherein said leakage current detecting circuit comprises:
 a MOS transistor of the first conductivity type for precharging having a source and drain connected between said power source node and a second signal wiring and for charging said second signal wiring to the power source potential during a period while said leakage current detecting circuit is being controlled by said pre-charge control signal or by the potential of said first signal wiring;
 a MOS transistor of a second conductivity type for detecting a leakage current having a drain and source connected between said second signal wiring and the ground potential and a gate connected to said ground potential; and
 a MOS transistor of the first conductivity type for pull-up having a source and drain connected between said power source node and said second signal wiring and a gate connected to said second signal wiring;

said leakage current correcting circuit having a MOS transistor of the first conductivity type for supplying the leakage correction current having a source and drain connected between said power source node and said first signal wiring and a gate connected to said second signal wiring.

8. A dynamic circuit according to claim 7, wherein a size of said MOS transistor for detecting the leakage current is set so that a current equivalent in amount to an amount of the leakage current generated in said plurality of discharging circuits between said first signal wiring and the ground potential flows through said MOS transistor for detecting the leakage current.

9. A dynamic circuit according to claim 8, wherein said plurality of discharging circuits includes n MOS transistors of the second conductivity type each having a same channel width a channel width of said MOS transistor for detecting a leakage current being the n times the width of each channel of said MOS transistors included in said discharging circuits.

10. A dynamic circuit, comprising:
a pre-charging circuit having a source and a drain connected between a power source node at a power source potential and a first signal wiring, said pre-charging circuit having a pre-charging MOS transistor of a first conductivity type, said pre-charging MOS transistor having a gate controlled by a pre-charge control signal, said pre-charging circuit for charging said first signal wiring to the power source potential during a period while said gate is controlled by said pre-charge control signal;

a plurality of discharging circuits connected between said first signal wiring and a ground potential, respectively, and for being turn-ON/OFF controlled according to a corresponding input signal;

a leakage current detecting circuit for detecting a current corresponding to a leakage current generated between said first signal wiring and said ground potential in a turn-OFF state of each of said discharging circuits; and a leakage current correcting circuit connected between said power source node and said first signal wiring and to leakage current detecting circuit for continuously supplying to said first signal wiring a leakage correction current equivalent to the leakage current of said first signal wiring during a time of a leakage current correction, wherein said leakage current detecting circuit comprises:
 a MOS transistor of the first conductivity type for precharging having a source and drain connected between said power source node and a second signal wiring and for charging said second signal wiring to the power source potential during a period while said leakage current detecting circuit is being controlled by said pre-charge control signal;
 a MOS transistor of a second conductivity type for detecting a leakage current having a drain and source connected between said second signal wiring and a ground potential and a gate connected to said ground potential; and
 a capacitor connected between said second signal wiring and said ground potential and which has a capacitance equivalent to a parasitic capacitance of said first signal wiring;

said leakage current correcting circuit including
 a MOS transistor of the first conductivity type for supplying the leakage correction current having a source and drain connected between said power source node and said first signal wiring, and
 a change-over circuit for selectively applying a potential of said second signal wiring or said power source potential to a gate of said MOS transistor for supplying the leakage correction current according to a logical level of a potential of said first signal wiring.

11. A dynamic circuit, comprising:
a precharging circuit having a source and a drain connected between a power source node at a power source potential and a first signal wiring, the pre-charging circuit having a pre-charging MOS transistor of a first conductivity type, said pre-charging MOS transistor having a gate potential controlled by a pre-charge control signal, said pre-charging circuit for charging said first signal wiring to the power source potential during a period while said gate potential is controlled by said pre-charge control signal;

a plurality of discharging circuits connected between said first signal wiring and a ground potential, respectively, and for being turn-ON/OFF controlled according to a corresponding input signal;

a leakage current detecting circuit for detecting a current corresponding to a leakage current generated between said first signal wiring and said ground potential in a turn-OFF state of each of said discharging circuits; and a leakage current correcting circuit connected between said power source node and said first signal wiring and to the leakage current detecting circuit for continuously supplying to said first signal wiring a leakage correction current equivalent to the leakage current of said first signal wiring during a time of a leakage current correction, wherein said leakage current detecting circuit comprises:
a MOS transistor of the first conductivity type for pre-charging having a source and drain connected between said power source node and a second signal wiring and for charging said second signal wiring to the power source potential during a period while said leakage current detecting circuit is being ON controlled by said pre-charge control signal;

a MOS transistor of a second conductivity type for detecting a leakage current having a drain and source connected between said second signal wiring and the ground potential and a gate connected to said ground potential;

a capacitor connected between said second signal wiring and said ground potential and which has a capacitance equivalent to a parasitic capacitance of said first signal wiring; and a voltage comparing circuit for comparing a potential of said second signal wiring with a predetermined reference potential and for generating an output potential according to the comparison;

said leakage current correcting circuit including
a MOS transistor of the first conductivity type for supplying a leakage correction current having a source and drain connected between said power source node and said first signal wiring, and a change-over circuit for selectively applying the output potential of said voltage comparing circuit or said power source potential to a gate of said MOS transistor for supplying the leakage correction current according to a logical level of a potential of said first signal wiring.

12. A dynamic circuit according to claim 11, wherein said leakage current detecting circuit is configured to detect a current different in amount from an amount of the leakage current generated between said first signal wiring and the ground potential.

13. A dynamic circuit, comprising:
a pre-charging circuit having a source and a drain connected between a power source node at a power source potential and a first signal wiring, said pre-charging circuit having a pre-charging MOS transistor of a first conductivity type, the pre-charging MOS transistor having a gate controlled by a pre-charge control signal, said pre-charging circuit for charging said first signal wring to the power source potential during a period while said gate is controlled by said pre-charge control signal;

a plurality of discharging circuits connected between said first signal wiring and a ground potential, respectively, and for being turn-ON/OFF controlled according to a corresponding input signal;

a leakage current detecting circuit for detecting a current corresponding to a leakage current generated between said first signal wiring and said ground potential in a turn-OFF state of each of said discharging circuits; and a leakage current correcting circuit connected between said power source node and said first signal wiring and to the leakage current detecting circuit for continuously supplying to said first signal wiring a leakage correction current equivalent to the leakage current of said first signal wiring during a time of a leakage current correction, wherein said leakage current detecting circuit is configured to detect a current equivalent in amount to an amount of the leakage current generated between said first signal wiring and the ground potential.

14. A dynamic circuit, comprising:
a pre-charging circuit having a source and a drain connected between a power source node at a power source potential and a first signal wiring, the pre-charging circuit having a pre-charging MOS transistor of a first conductivity type having a gate controlled by a pre-charge control signal, said pre-charging circuit for charging said first signal wiring to the power source potential during a period while said gate is controlled by said pre-charge control signal;

a plurality of discharging circuits connected between said first signal wiring and a ground potential, respectively, and for being turn-ON/OFF controlled according to a corresponding input signal;

a leakage current detecting circuit for detecting a current corresponding to a leakage current generated between said first signal wiring and said ground potential in a turn-OFF state of each of said discharging circuits; and a leakage current correcting circuit connected between said power source node and said first signal wiring and to the leakage current detecting circuit for continuously supplying to said first signal wiring a leakage correction current equivalent to the leakage current of said first signal wiring during a time of a leakage current correction, wherein said leakage current detecting circuit comprises:
a MOS transistor of the first conductivity type for pre-charging having a source and drain connected between said power source node and a second signal wiring, for charging said second signal wiring to a power source potential during a period while said leakage current detecting circuit is being ON controlled by said pre-charge control signal;

a MOS transistor of a second conductivity type for detecting the leakage current having a drain and source connected between said second signal wiring and the ground potential and a gate connected to said ground potential, the MOS transistor being set to a size so that a current equivalent to the leakage current flows in the MOS transistor, a capacitor connected between said second signal wiring and said ground potential and which has a capacitance equivalent to a parasitic capacitance of said first signal wiring; and a voltage comparing circuit for comparing a potential of said second signal wiring with a predetermined reference potential and for generating an output potential according to the comparison;

said leakage current correcting circuit including
a MOS transistor of the first conductivity type for supplying the leakage correction current having a source and drain connected between said power source node and said first signal wiring, and a change-over circuit for selectively applying the output potential of said voltage comparing circuit or said power source potential to the gate of said MOS transistor for supplying the leakage correction current according to a logical level of a potential of said first signal wiring.

15. A dynamic circuit, comprising:

a pre-charging circuit having a source and a drain connected between a power source node at a power source potential and a first signal wiring, said pre-charging circuit having a pre-charging MOS transistor of a first conductivity type, said pre-charging MOS transistor having a gate controlled by a pre-charge control signal, said pre-charging circuit for charging said first signal wiring to the power source potential during a period while said gate is controlled by said pre-charge control signal;

a plurality of discharging circuits connected between said first signal wiring and a ground potential, respectively, and for being turn-ON/OFF controlled according to a corresponding input signal;

a leakage current detecting circuit for detecting a current equivalent to a leakage current generated between said first signal wiring and said ground potential in a turn-OFF state of each of said discharging circuits, the leakage current detecting circuit including a leakage current detecting transistor having a channel width such that the current equivalent to the leakage current flows through the leakage current detecting transistor; and a leakage current correcting circuit connected between said power source node and said first signal wiring and to the leakage current detecting circuit for continuously supplying to said first signal wiring a leakage correction current equivalent to the leakage current of said first signal wiring during a time of a leakage current correction.

16. A dynamic circuit, comprising:

a pre-charging circuit having a source and a drain connected between a power source node at a power source potential and a first signal wiring, the pre-charging circuit having a pre-charging MOS transistor of a first conductivity type, said pre-charging MOS transistor having a gate controlled by a pre-charge control signal, said pre-charging circuit for charging said first signal wiring to the power source potential during a period while said gate is controlled by said pre-charge control signal;

a plurality of discharging circuits connected between said first signal wiring and a ground potential, respectively, and for being turn-ON/OFF controlled according to a corresponding input signal;

a leakage current detecting circuit for detecting a current corresponding to a leakage current generated between said first signal wiring and said ground potential in a turn-OFF state of each of said discharging circuits; and a leakage current correcting circuit connected between said power source node and said first signal wiring and to the leakage current detecting circuit for continuously supplying to said first signal wiring a leakage correction current equivalent to the leakage current of said first signal wiring during a time of a leakage current correction, wherein said leakage current detecting circuit comprises:

a MOS transistor of the first conductivity type for pre-charging having a source and drain connected between said power source node and a second signal wiring and for charging said second signal wiring to the power source potential during a period while said leakage current detecting circuit is being ON controlled by said pre-charge control signal;

a MOS transistor of a second conductivity type for detecting the leakage current having a drain and source connected between said second signal wiring and the ground potential and a gate connected to said ground potential, the MOS transistor having a channel width such that the current equivalent to the leakage current flows in the MOS transistor;

a capacitor connected between said second signal wiring and said ground potential and which has a capacitance equivalent to a parasitic capacitance of said first signal wiring; and a voltage comparing circuit for comparing a potential of said second signal wiring with a predetermined reference potential and for generating an output potential according to the comparison;

said leakage current correcting circuit including the MOS transistor of the first conductivity type for supplying a leakage correction current having a source and drain connected between said power source node and said first signal wiring, and a change-over circuit for selectively applying the output potential of said voltage comparing circuit or said power source potential to a gate of said MOS transistor for supplying the leakage correction current according to a logical level of a potential of said first signal wiring.

* * * * *